(12) United States Patent
Gershon et al.

(10) Patent No.: US 9,741,890 B2
(45) Date of Patent: Aug. 22, 2017

(54) PROTECTIVE INSULATING LAYER AND CHEMICAL MECHANICAL POLISHING FOR POLYCRYSTALLINE THIN FILM SOLAR CELLS

(71) Applicant: INTERNATIONAL BUSINESS MACHINES CORPORATION, Armonk, NY (US)

(72) Inventors: Talia S. Gershon, White Plains, NY (US); Supratik Guha, Chappaqua, NY (US); Jeehwan Kim, White Plains, NY (US); Mahadevaiyer Krishnan, Hopewell Junction, NY (US); Byungha Shin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 13/969,046

(22) Filed: Aug. 16, 2013

(65) Prior Publication Data
US 2014/0305499 A1  Oct. 16, 2014

Related U.S. Application Data

(63) Continuation of application No. 13/861,847, filed on Apr. 12, 2013, now Pat. No. 8,889,466.

(51) Int. Cl.
*H01L 31/18* (2006.01)
*H01L 31/0384* (2006.01)
(Continued)

(52) U.S. Cl.
CPC ...... *H01L 31/18* (2013.01); *H01L 31/022466* (2013.01); *H01L 31/0322* (2013.01);
(Continued)

(58) Field of Classification Search
None
See application file for complete search history.

(56) References Cited

U.S. PATENT DOCUMENTS 4,239,553 A * 12/1980 Barnett ............ H01L 31/03365
136/256
4,544,797 A * 10/1985 Hewig ............ H01L 31/022425
136/249
(Continued)

FOREIGN PATENT DOCUMENTS

| CN | 101587918 A | 11/2009 | |
| JP | 2641800 B2 * | 8/1997 | ..... H01L 31/035281 |
| JP | 2009164544 A | 7/2009 | |

OTHER PUBLICATIONS

Definition of grain [retrieved from http://thefreedictionary.com/grain on Dec. 2, 2015].*

(Continued)

*Primary Examiner* — Eric R Smith
(74) *Attorney, Agent, or Firm* — Tutunjian & Bitetto, PC; Louis Percello

(57) ABSTRACT

A method for forming a photovoltaic device includes forming an absorber layer with a granular structure on a conductive layer; conformally depositing an insulating protection layer over the absorber layer to fill in between grains of the absorber layer; and planarizing the protection layer and the absorber layer. A buffer layer is formed on the absorber layer, and a top transparent conductor layer is deposited over the buffer layer.

11 Claims, 8 Drawing Sheets

(51) Int. Cl.
  *H01L 31/0216* (2014.01)
  *H01L 31/032* (2006.01)
  *H01L 31/0749* (2012.01)
  *H01L 31/0224* (2006.01)
  *H01L 31/0392* (2006.01)

(52) U.S. Cl.
  CPC .... *H01L 31/0326* (2013.01); *H01L 31/03923* (2013.01); *H01L 31/0749* (2013.01); *H01L 31/1884* (2013.01); *Y02E 10/541* (2013.01)

(56) References Cited

U.S. PATENT DOCUMENTS

| | | | | |
|---|---|---|---|---|
| 5,100,478 | A * | 3/1992 | Kawabata | H01L 31/061 136/249 |
| 5,482,570 | A * | 1/1996 | Saurer et al. | 136/255 |
| 5,674,325 | A * | 10/1997 | Albright | H01L 31/0368 136/244 |
| 6,023,020 | A * | 2/2000 | Nishitani | H01L 31/0322 136/255 |
| 7,652,209 | B2 | 1/2010 | Delahoy | |
| 8,183,121 | B2 | 5/2012 | Schricker et al. | |
| 8,212,143 | B2 | 7/2012 | Tsai et al. | |
| 2002/0023674 | A1 * | 2/2002 | Sugawara | H01L 31/035281 136/243 |
| 2006/0180200 | A1 | 8/2006 | Platzer Bjorkman et al. | |
| 2008/0092946 | A1 * | 4/2008 | Munteanu et al. | 136/252 |
| 2009/0165855 | A1 | 7/2009 | Sun et al. | |
| 2009/0205709 | A1 | 8/2009 | Kim | |
| 2009/0314342 | A1 * | 12/2009 | Bent et al. | 136/256 |
| 2010/0186805 | A1 | 7/2010 | Krunks et al. | |
| 2010/0243056 | A1 * | 9/2010 | Korevaar | H01L 31/02963 136/260 |
| 2011/0067755 | A1 | 3/2011 | Hakuma et al. | |
| 2011/0094557 | A1 | 4/2011 | Mitzi et al. | |
| 2011/0097496 | A1 | 4/2011 | Mitzi et al. | |
| 2011/0100458 | A1 | 5/2011 | Kang et al. | |
| 2011/0114157 | A1 * | 5/2011 | Meissner | H01L 31/022425 136/250 |
| 2011/0232760 | A1 * | 9/2011 | Shirata | H01L 31/0322 136/262 |
| 2011/0259424 | A1 * | 10/2011 | Basol | H01L 21/02422 136/260 |
| 2011/0312120 | A1 * | 12/2011 | Weiner | H01L 31/03923 438/64 |
| 2012/0006395 | A1 | 1/2012 | Boussaad et al. | |
| 2012/0024366 | A1 | 2/2012 | Liu et al. | |
| 2012/0042942 | A1 | 2/2012 | Park et al. | |
| 2012/0061790 | A1 | 3/2012 | Ahmed et al. | |
| 2012/0167979 | A1 | 7/2012 | Perng et al. | |
| 2012/0167980 | A1 | 7/2012 | Engelhart | |
| 2012/0196399 | A1 * | 8/2012 | Ding | C23C 14/024 438/98 |
| 2012/0222735 | A1 | 9/2012 | Xu | |
| 2013/0327377 | A1 * | 12/2013 | Ting | H01L 51/4246 136/255 |

OTHER PUBLICATIONS

Machine translation of JP2641800B2.*
Definition of "Abrasion" [retrieved from http://www.thefreedictionary.com/abrasion on Oct. 27, 2016].*
Cesar, I., et al. "Excellent Rear Side Passivation on Multi-Crystalline Silicon Soloar Cells With 20 Nm Uncapped Al2O3 Layer: Industrialization of ALD for Solar Cell Applications" Photovoltaic Specialists, IEEE Conference—PVSC. Jun. 2010. (6 Pages).
Chan, C., et al. "Growth and Characterization of Cu2ZnSnS4 Nanostructures Using Anodized Aluminum as the Growth Mask" Nanoscale Photonic and Cell Technologies for Photovoltaics II, Proc. of SPIE vol. 7411. Aug. 2009. (9 Pages).
Dingemans, et al. "Status and Prospects of Al2O3-Based Surface Passivation Schemes for Silicon Solar Cells" Journal of Vacuum Science & Technology A: Vacuum, Surfaces, and Films, vol. 30, Issue: 4. Jul. 2012. pp. 1-27.
Hsu, W., et al. "Surface Passivation of Cu(In,Ga)Se2 Using Atomic Layer Deposition Al2O3" Applied Physics Letters, vol. 100. Nov. 2012. (4 Pages).
Katagiri, H., et al. "Development of CZTS-Based Thin Film Solar Cells" Thin Solid Films, vol. 517, No. 7. Feb. 2009. pp. 2455-2460.
Kessels, W., et al. "Atomic Layer Deposition: Prospects for Solar Cell Manufacturing" Photovoltaic Specialists Conference (PVSC '08). 33rd IEEE. May 2008. (5 Pages).
Saint-Cast, P., et al. "High-Efficiency C-Si Solar Cells Passivated With ALD and PECVD Aluminum Oxide" IEEE Electron Device Letters, vol. 31, No. 7. Jul. 2010. pp. 695-697.
Todorov, T., et al. "High-Efficiency Solar Cell With Earth-Abundant Liquid-Processed Absorber" Advanced Energy Materials. Feb. 2010. pp. E156-E159.
Vermang, B., et al. "Spatially-Separated Atomic Layer Deposition of Al2O3, a New Option for High-Throughput Si Solar Cell Passivation" 37th IEEE Photovoltaic Specialists Conf. Jun. 2011. (6 Pages).
Yan, Y. "Understanding of Defect Physics in Polycrystalline Photovoltaic Materials" 37th IEEE Photovoltaic Specialists Conference (PVSC 37). Jun. 2011. pp. 1218-1222.

* cited by examiner

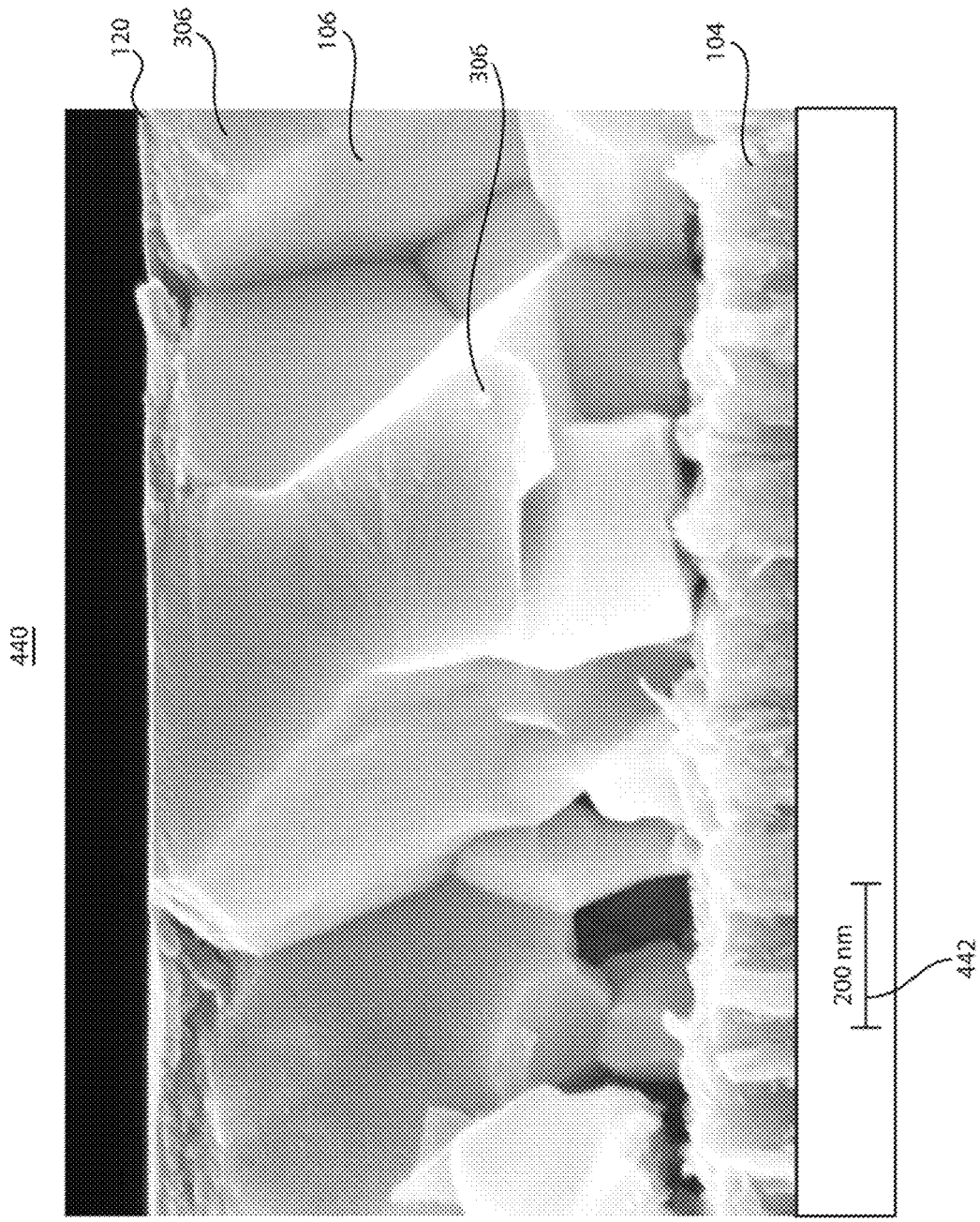

PROTECTIVE INSULATING LAYER AND CHEMICAL MECHANICAL POLISHING FOR POLYCRYSTALLINE THIN FILM SOLAR CELLS

RELATED APPLICATION INFORMATION

This application is a Continuation application of co-pending U.S. patent application Ser. No. 13/861,847 filed on Apr. 12, 2013, incorporated herein by reference in its entirety. This application is related to commonly assigned U.S. patent application Ser. No. 13/685,126 filed on Nov. 26, 2012, incorporated herein by reference in its entirety.

BACKGROUND

Technical Field

The present invention relates to photovoltaic cells, and more particularly to devices and methods for improving absorber structures by preventing mass migration between grains in the structures.

Description of the Related Art

Photovoltaic devices often include exotic materials that are both rare and often toxic. For example, thin-film materials of the type $Cu(In,Ga)(S,Se)_2$ (CIGS), while efficient, include rare indium metal, which is expected to be of high cost and short supply in future large-scale photovoltaic device production—an issue which is further exacerbated by the growing indium consumption for thin film display production. Other materials such as $Cu_2S$ and CdTe have also been proposed as absorbers but while $Cu_2S$ suffers from low stability in devices, rare tellurium and toxic cadmium limits CdTe usage.

Polycrystalline $Cu_2ZnSnS_4$ (CZTS) is an emerging material for solar cell absorbers which is cheap and earth-abundant. Large grain structures are good for device performance; however, grooves formed between large grains often become a shunting path (through which a buffer layer, such as CdS, makes contact to a bottom electrode). Sometimes a CZTS film delaminates off a substrate (typically Mo coated glass) during deionized (DI) water rinsing. It appears that capillary force exerted by DI water into the grooves is one of the causes of the film failure.

SUMMARY

A method for forming a photovoltaic device includes forming an absorber layer with a granular structure on a conductive layer; conformally depositing an insulating protection layer over the absorber layer to fill in between grains of the absorber layer; and planarizing the protection layer and the absorber layer. A buffer layer is formed on the absorber layer, and a top transparent conductor layer is deposited over the buffer layer.

A method for forming a photovoltaic device includes depositing a conductive layer on a glass substrate; forming an absorber layer formed from a Cu—Zn—Sn containing chalcogenide material on the conductive layer wherein the Cu—Zn—Sn containing chalcogenide material is a compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$; conformally depositing a protection layer over the absorber layer to fill in between grains of the absorber layer by an atomic layer deposition process; planarizing the protection layer and the absorber layer by performing a chemical mechanical polishing process to remove unwanted secondary phase material from a surface of the absorber layer; forming a buffer layer on the absorber layer; forming a first transparent conductor layer on the buffer layer; and depositing a second transparent conductor layer on the first transparent conductor layer.

A photovoltaic device includes a conductive layer, an absorber layer formed on the conductive layer including a granular structure with gaps between grains and a protection layer formed in the gaps between grains of the absorber layer. A buffer layer is formed on the absorber layer. A top transparent conductor layer is formed over the buffer layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 10 is a cross-sectional view SEM image showing a CZTS surface after chemical mechanical polishing (CMP) showing gaps remaining filled in accordance with the present principles;

DETAILED DESCRIPTION OF PREFERRED EMBODIMENTS

Figure 1:
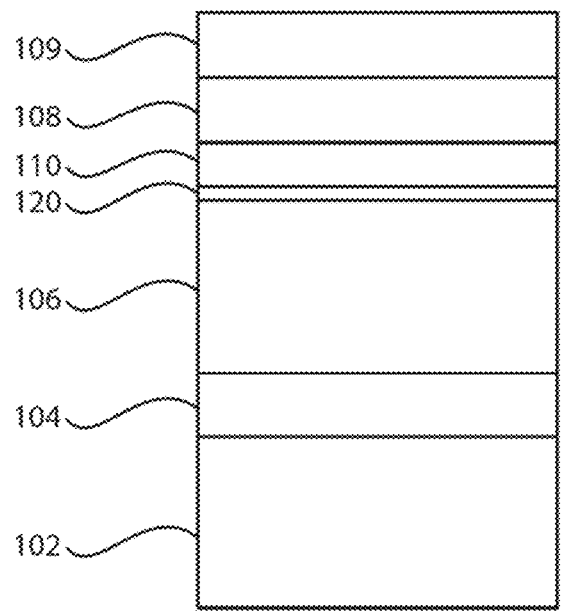
FIG. 1 is a cross-sectional view of a photovoltaic device in accordance with the present principles.

In accordance with the present principles, photovoltaic devices are provided having a polycrystalline absorber layer. The absorber layer has a structure that includes grains. In one embodiment, the absorber layer may include Cu—Zn—

Sn containing chalcogenide compound, such as an earth abundant CZTS ($Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$), as an absorber material, which is surfaced to reduce the possibility of layer lift-off due to rinsing or other processing. While this material is preferred, other large grain absorber materials may be employed including $Cu(In,Ga)(S,Se)_2$ (CIGS), $Cu_2S$, CdTe, etc.

In one embodiment, a thin insulating layer is conformally applied to cover the absorber surface. The thin insulating layer fills gaps between grains. By filling between grains, the thin insulating layer prevents contact with a bottom electrode and provides better adhesion between grains to prevent lift off or mechanical film failure. In one embodiment, the thin insulating layer or protection layer is applied by atomic layer deposition (ALD), although other processes may be employed. The thin insulating layer may include $Al_2O_3$, although other materials are contemplated.

After depositing the thin insulating layer, a chemical mechanical polishing (CMP) process may be employed to planarize a top surface of the absorber layer. In one embodiment, the CMP employs silica nanoparticles to re-expose the absorber layer surface while the gaps remain filled with the insulating layer. CMP reduces the surface roughness of the absorber layer. The CMP will also remove unwanted secondary phase particles/grains, which sometimes form on top of a CZTS surface, e.g., ZnS grains. An optional etch may be performed after the CMP with, e.g., a bromine solution, to reduce damage from the CMP. Then, deposition of additional layers, such as e.g., a buffer layer and a window or contact layer, etc. may then be formed to complete the device.

It is to be understood that the present invention will be described in terms of a given illustrative architecture having illustrative substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells, panels or modules employed to provide power to electronic devices, homes, buildings, vehicles, etc.

It should also be understood that material compounds will be described in terms of listed elements, e.g., CdS. These compounds include different proportions of the elements within the compound, e.g., CdS includes $Cd_xS_{1-x}$ where x is less than or equal to 1, etc. In addition, other elements may be included in the compound, such as, e.g., dopants, etc. and still function in accordance with the present principles.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed with or as a tandem (multi-junction) structure; however, other architectures, structures, substrate materials and process features and steps may be varied within the scope of the present invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors, photosensitive devices or other photovoltaic applications. The structure 100 includes a substrate 102. The substrate 102 may include glass or other inexpensive substrate, such as metal, plastic or other material suitable for photovoltaic devices (e.g., quartz, silicon, etc.). A conductive layer 104 is formed on the substrate 102 (if the substrate in non-conductive). The conductive layer 104 may include molybdenum although other high work-function materials may be employed (e.g., Pt, Au, etc.). The layer 104 provides a metal contact.

A buffer layer 110 may include CdS or other materials that serve as an N-type layer. An absorber layer 106 preferably includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. The Cu—Zn—Sn containing chalcogenide compound will be referred to throughout this disclosure for illustrative purposes; however, other absorber materials may include, e.g., Cu(In,Ga)(S,Se)$_2$ (CIGS), Cu$_2$S, CdTe, etc. The Cu—Zn—Sn-containing chalcogenide, such as a Cu$_2$ZnSn(S,Se)$_4$ (referred to hereafter as CZTS for ease of reference) based layer serves as a P-type material. In one embodiment, the CZTS film has a thickness of between about 0.2 to 4.0 microns and more preferably about 2 microns. Layer 106 may be formed by painting, sputtering, co-evaporation, electroplating, spin coating, slit casting, doctor blading, dip coating or other simple coating processes. In one illustrative embodiment, absorber layer 106 includes CZTS (or CZTS with some Se substituted for S) which provides a band gap ($E_g$) from about 1 to 1.5 eV. Although the major elements in CZTS are Cu, Zn, Sn, S, Se, reference to CZTS or Cu—Zn—Sn containing chalcogenide material also includes compositions that optionally contain Ge replacing some or all of the Sn and that may also contain other dopants, including, e.g., Sb, Bi, Na, K, Li, Ca, etc.

In a particularly useful embodiment, Cu$_2$ZnSn(S, Se)$_4$ (CZTS or CZTSe) is employed for the absorber layer 106. CZTS has many benefits. It is low cost and environmentally harmless, being fabricated using naturally abundant materials. CZTS provides good optical properties and has a band-gap energy from approximately 1 to 1.5 eV, depending on the degree of substitution of S with Se, and a large absorption coefficient in the order of $10^4$ cm$^{-1}$. This eliminates the reliance on rare indium metal. The efficiency of CZTS can be maximized by making a tandem cell with an amorphous silicon cell having higher band gap and thus allowing more effective light harvesting across the solar spectrum.

Layer 110 is preferably thin, e.g., 1 nm to about 100 nm, more preferably around 5 nm to around 70 nm. The layer 110 provides an N-type layer (e.g., n-CdS). Layer 104 (e.g., Mo layer) can be thicker than layer 110 to enable sufficient conductivity for adequate series resistance. Preferably, layer 104 has a thickness of from around 100 nm to around 2000 nm. More preferably, layer 104 has a thickness of from around 250 nm to around 1000 nm. Other N-type layers can also be employed for buffer layer 110, including, e.g., ZnS, CdTe, Zn(O,S) (zinc oxysulfide), In$_2$S$_3$ and ZnO.

In accordance with one embodiment, a deposition process is employed to provide an insulating or protection layer 120 between the buffer (or emitter) layer 110 and the absorber layer 106. The deposition process may include atomic layer deposition (ALD), although other deposition processes may be employed to conformally form the protection layer 120. The protection layer 120 is preferably ultra-thin, e.g., less than about 25 Angstroms thick, although greater thicknesses may be employed. It should be understood that thicker layers may be employed with different materials or structures. ALD includes exposing a surface to stages of flowing gases to reduce undesirable interactions and promote pristine and high quality material layers. The protection layer 120 may include a metal oxide, such as e.g., Al$_2$O$_3$, although other material may be employed, such as HfO$_2$, etc. The protection layer 120 fills gaps between grains of the absorber layer 106 to prevent mass migration between the buffer layer 110 through the absorber layer 106. The protection layer 120 and the absorber layer 120 are planarized before forming the buffer layer 110. This process and some of its advantages will be described in greater detail hereinafter.

The buffer layer 110 may have two transparent conductive layers, a first transparent conductive layer 108 and a second transparent conductive layer 109. The first transparent conductive layer 108 may include a conventional nominally intrinsic ZnO layer having a thickness of between about 40 and 120 nm, or more preferably about 80 nm. A second transparent conductive layer 109 is formed over the first transparent conductive layer 108 (or layer 110 if the first transparent conductive layer 108 is not included). The second transparent conductive layer 109 may include a transparent conductive oxide (TCO), such as, e.g., indium tin oxide (ITO), aluminum doped zinc oxide (AZO), boron doped zinc oxide (BZO) or other TCO materials. The second transparent conductive layer 109 may include a thickness of between about 100 and 300 nm.

Figure 2:
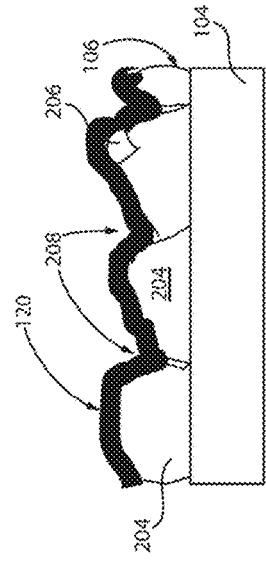
FIG. 2 is a cross-sectional view of an absorber layer formed on a bottom electrode in accordance with the present principles.

Referring to FIG. 2, an illustrative process flow is shown and described for forming an absorber layer 106 for a photovoltaic device 200 in accordance with the present principles. The substrate 102 (FIG. 1) includes a bottom electrode 104 on which the absorber layer 106 is to be formed. In this example, the absorber layer 106 includes Cu—Zn—Sn containing chalcogenide compound, such as an earth abundant CZTS ($Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$), as an absorber material. Grains 204 of CZTS material and, in some cases, unwanted secondary phase particle 206 form in the absorber layer 106. The grains 204 may be large in size and include gaps 208.

Figure 3:
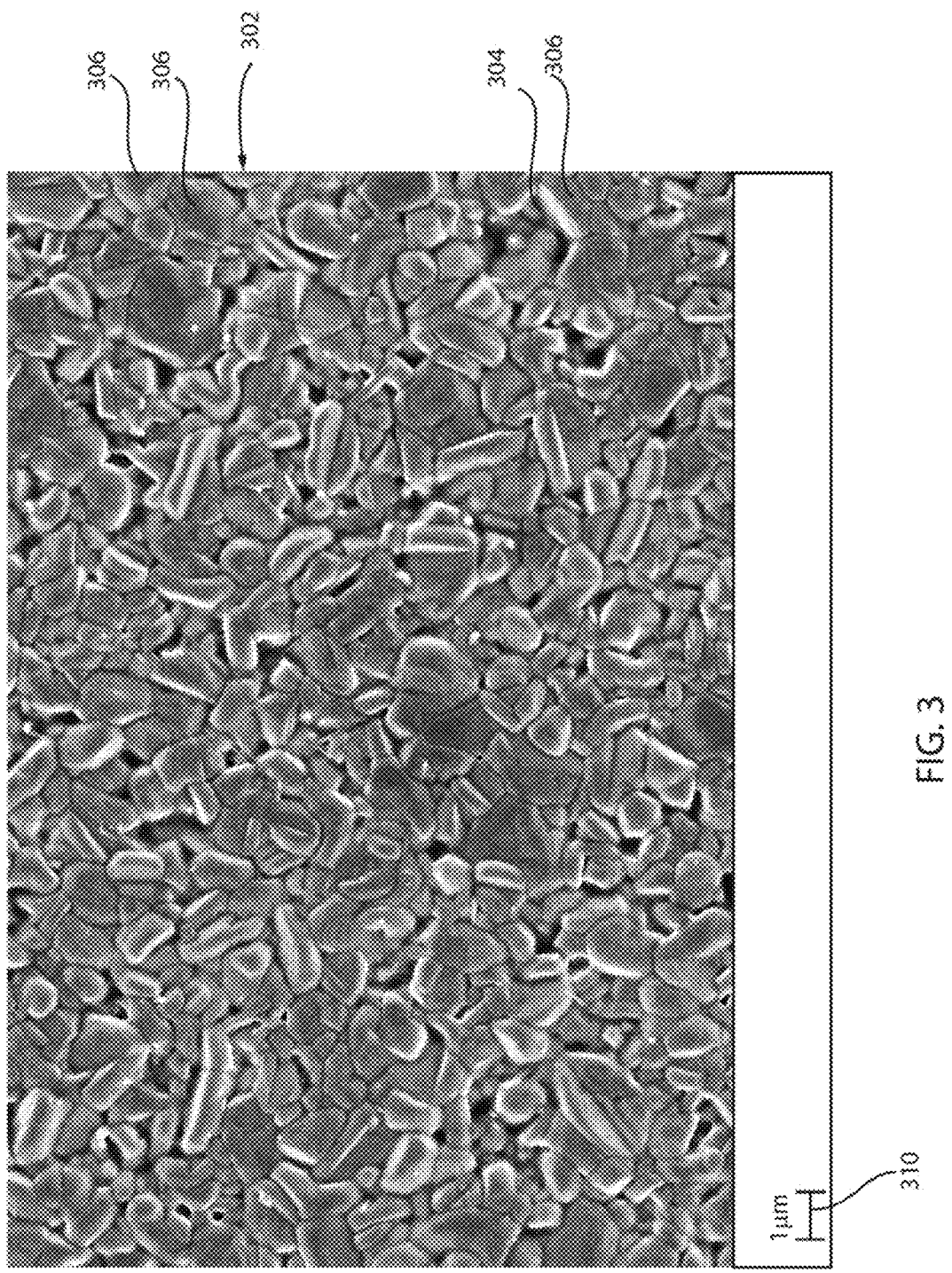
FIG. 3 is a plan view of a scanning electron microscope (SEM) image showing a CZTS surface with deep spaces or gaps (dark areas) between grains before processing in accordance with the present principles.

Referring to FIG. 3, a plan view of a scanning electron microscope (SEM) image 302 shows a CZTS surface with deep spacings or gaps 304 (dark areas) between grains 306. The spacings 304 between the grains 306 provide an opportunity for buffer material (e.g., CdS) to migrate through to get to potentially contact the bottom electrode (104). The scale 310 is one micron.

Figure 4:
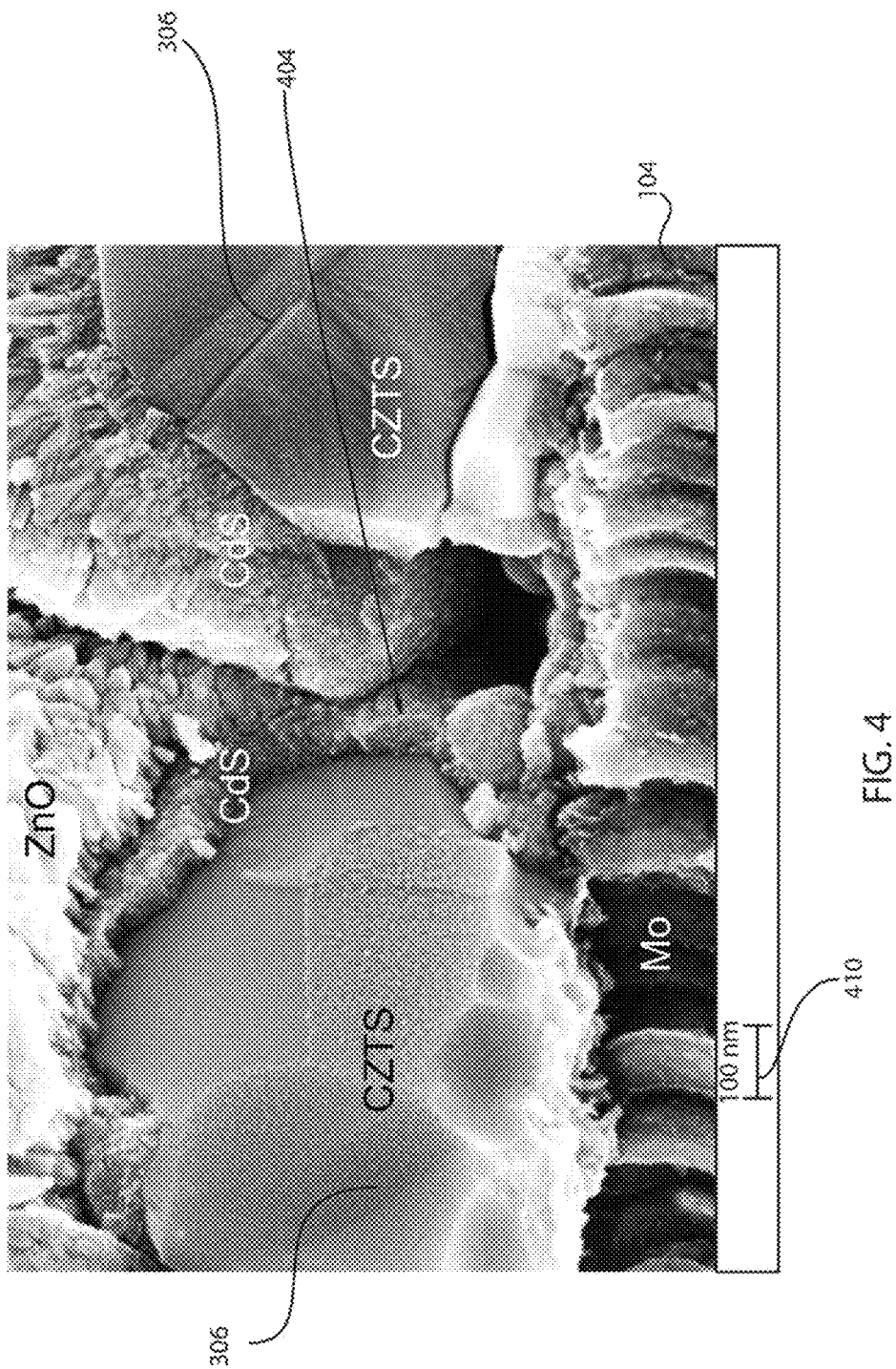
FIG. 4 is a SEM cross-sectional image showing CdS from a buffer layer migrating between grains of CZTS of the absorber layer to reach or nearly reach a Mo bottom electrode in accordance with the prior art.

Referring to FIG. 4, a SEM cross-sectional image 402 shows CdS 404 from the buffer layer 110 migrating between grains 306 of CZTS of absorber layer 106 to reach or nearly reach the Mo bottom electrode 104 in a conventional device. This mechanism, which may be caused by rinsing the device with deionized (DI) water may cause delamination or partial delamination of the absorber layer 106. The scale 410 is 100 nm.

Figure 5:
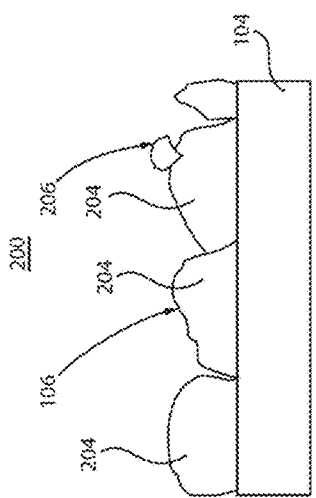
FIG. 5 is a cross-sectional view of the absorber layer having a protection layer formed to fill in gaps between grains in accordance with the present principles.

Referring to FIG. 5, a thin insulating or protection layer 120 is conformally applied to cover the CZTS of layer 106 and fill in the gaps 208 in between grains 204 at or near the surface thereof. By filling between grains 204, the thin protection layer 120 prevents contact with the bottom electrode 104 and provides better adhesion between grains 204 to prevent lift off or mechanical film failure. In one embodiment, the thin protection layer 120 may be applied by atomic layer deposition (ALD), although other processing may be employed. The protection layer 120 may include $Al_2O_3$, although other materials are contemplated.

Figure 6:
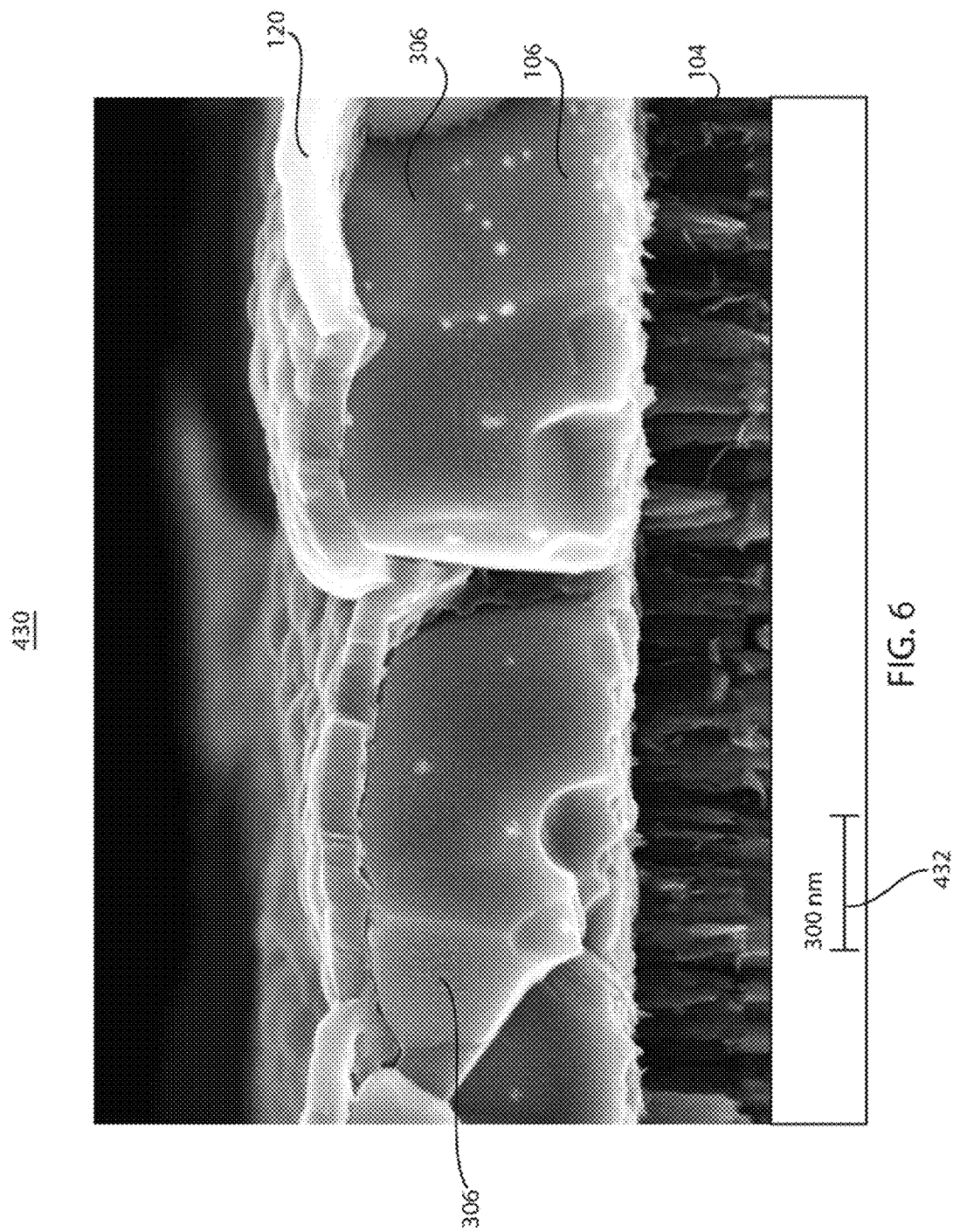
FIG. 6 is a SEM cross-sectional image showing the absorber layer having the protection layer formed to fill in gaps between grains in accordance with the present principles.

Referring to FIG. 6, a SEM cross-sectional image 430 shows protection layer 120 filling in the gaps between grains 306 of CZTS of absorber layer 106. The scale 432 is 300 nm.

Figure 7:
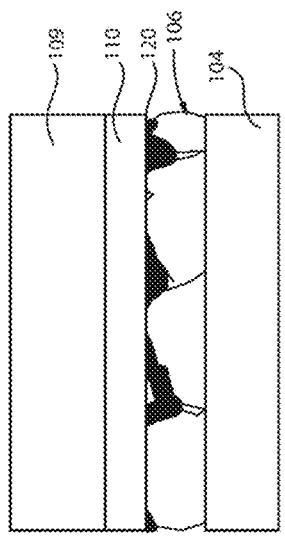
FIG. 7 is a cross-sectional view showing the absorber layer and the protection layer planarized in accordance with the present principles.

Referring to FIG. 7, after depositing the protection layer 120, a planarizing process is performed such as, e.g., a chemical mechanical polishing (CMP). The CMP process may be employed to planarize a top surface of the absorber layer 106 (CZTS and the protection layer 120). In one embodiment, the CMP employs silica nanoparticles to re-expose the surface of the absorber layer 106 while the gaps 208 remain filled with the material of the protection layer 120. CMP reduces the surface roughness of CZTS and removes unwanted secondary phase particles/grains, which sometimes form on top of CZTS surface, e.g., ZnS grains. An optional etch may be performed after the CMP with e.g., a bromine solution or other acid etchant, to reduce any CMP damage.

Figure 8:
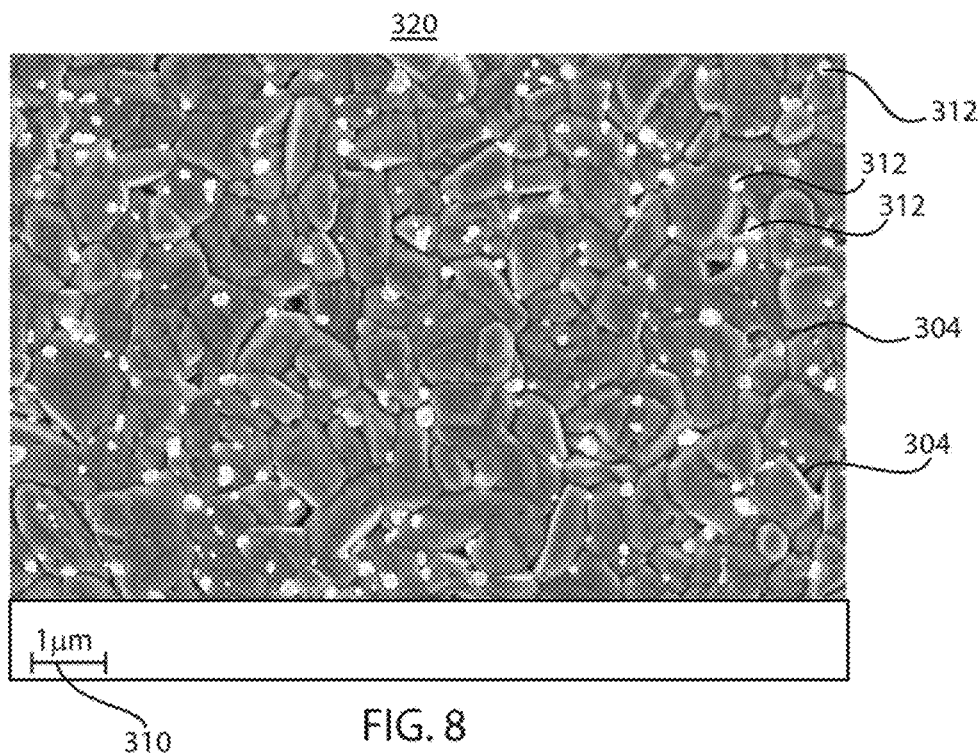
FIG. 8 is a plan view SEM image showing a CZTS surface with reduced spaces or gaps and including unwanted secondary phases before planarizing the surface in accordance with the present principles.

Referring to FIG. 8, a plan view of a SEM image 320 shows a CZTS surface before CMP. Light portions show an unwanted secondary phase 312, e.g., ZnS. The gaps 304 are noticeably and significantly reduced by the protection layer 120, which is formed over the CZTS surface. The scale 310 is 1 micron.

Figure 9:
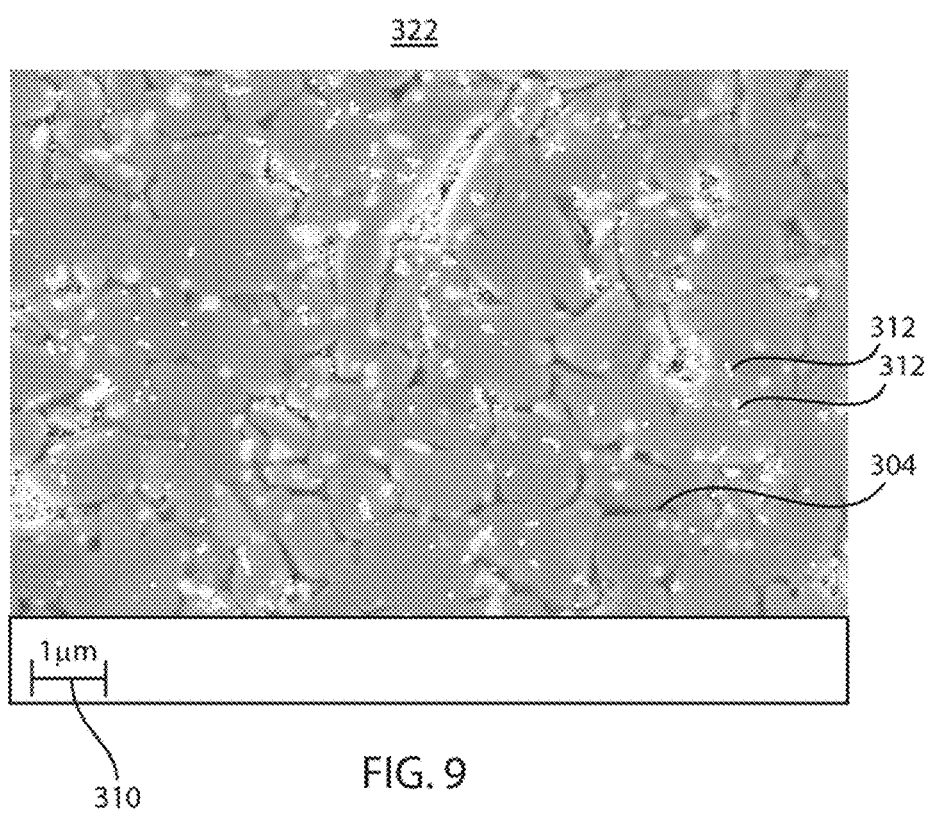
FIG. 9 is a plan view SEM image showing the CZTS surface of FIG. 8 after three minutes of chemical mechanical polishing (CMP) in accordance with the present principles.

Referring to FIG. 9, a plan view of a SEM image 322 shows a CZTS surface after 3 minutes of CMP using silica nanoparticles. Light portions of the unwanted secondary phase 312 are reduced as well as any gaps 304. The scale 310 is 1 micron.

Referring to FIG. 10, a SEM cross-sectional image 440 shows protection layer 120 filling in the gaps between grains 306 of CZTS of absorber layer 106 after CMP. The scale 442 is 200 nm.

Figure 11:
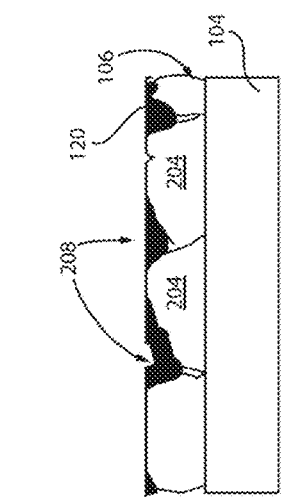
FIG. 11 is a cross-sectional view showing a buffer layer and a transparent conductive electrode formed in accordance with the present principles.

Referring to FIG. 11, processing continues with the formation of the buffer layer 110, the first transparent conductive oxide layer 108 (not shown in FIG. 11) and the second transparent conductive oxide layer 109. The deposition of these layers may be performed using known processes to complete the device.

Figure 12:
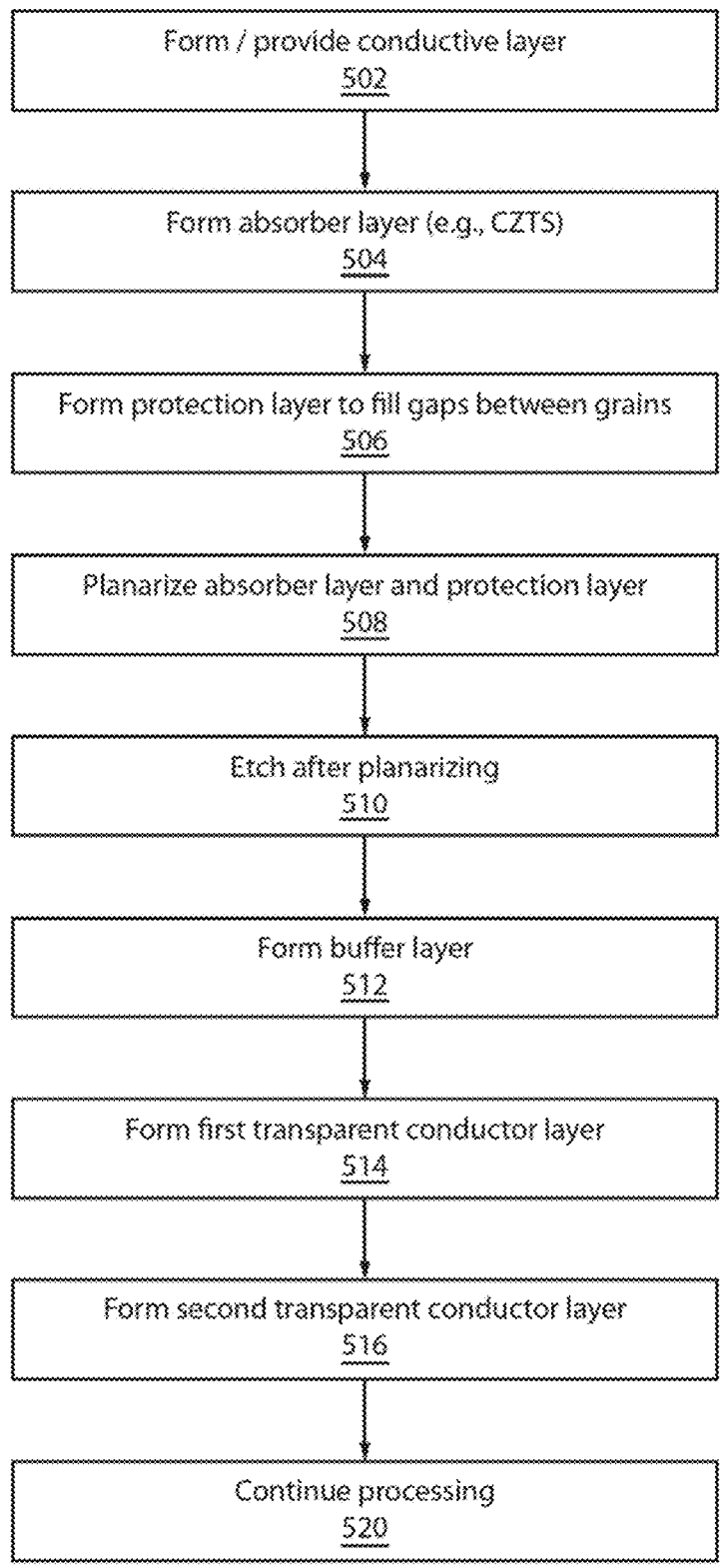
FIG. 12 is a block/flow diagram for forming a photovoltaic device in accordance with illustrative embodiments.

Referring to FIG. 12, methods for forming photovoltaic devices are illustratively shown. The flowchart and block diagrams in FIG. 12 illustrate the architecture, functionality, and operation of possible implementations of systems and methods according to various embodiments of the present invention. It should also be noted that, in some alternative implementations, the functions noted in the blocks may occur out of the order noted in FIG. 12. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In block 502, a conductive layer is provided as a substrate, or deposited/formed on a substrate. The conductive layer preferably includes a high work function material, such as, a metal, e.g., Mo, Pt, Au, etc. The substrate may include a glass, metal or other material. In block 504, an absorber layer is formed, e.g., from a Cu—Zn—Sn containing chalcogenide material on the conductive layer, although other large-grained absorber materials may also be employed. The Cu—Zn—Sn containing chalcogenide material includes a compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. The CZTS material is polycrystalline in form and includes grains/grain boundaries. In block 506, a protection layer is conformally deposited over the absorber layer to fill in between grains of the absorber layer. The protection layer may be deposited by employing an atomic layer deposition (ALD) process. The protection layer may include $Al_2O_3$ with a thickness of less than about 25 Angstroms, although other materials may be employed and other thickness may be used.

In block 508, the protection layer and the absorber layer are planarized such that the gaps between grains in the absorber layer remain filled. The planarizing includes performing a chemical mechanical polishing process. The planarizing step also removes unwanted secondary phase material from a surface of the absorber layer.

In block 510, a surface of the protection layer and the absorber layer may be etched after the planarizing step. A bromine solution may be employed although or wet etchants (e.g., acids) may be employed.

In block 512, a buffer layer is formed on the absorber layer. The buffer layer may include one of CdS, ZnS, CdTe, Zn(O,S), $In_2S_3$ and/or ZnO. In block 514, a first transparent conductive layer may optionally be formed between the buffer layer and a second transparent conductor layer. In block 516, the second transparent conductor layer is deposited over the buffer layer (and the first transparent conductor layer, if present). In block 520, processing continues as needed. It should be understood that the protection layer may be employed with other layers instead of or in addition to the absorber layer to prevent unwanted mass transfer between grains.

Having described preferred embodiments for a protective insulating layer and chemical mechanical polishing for polycrystalline thin film solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
a conductive layer;
an absorber layer formed on the conductive layer including a granular structure with gaps between grains having an irregular shape, wherein each gap includes at least one grain boundary;
an insulating, planarized protection layer formed to fill in the gaps between grains of the absorber layer and extending less than a full depth of the absorber layer, wherein the absorber layer is re-exposed on a side opposite the conductive layer through portions of the protection layer to form a planarized surface having materials of the absorber layer and the planarized protection layer disposed within non-uniform surface areas of the planarized surface;

a buffer layer formed on the absorber layer; and
a top transparent conductor layer formed over the buffer layer.

2. The device as recited in claim 1, further comprising an additional transparent conductive layer formed between the buffer layer and the top transparent conductor layer.

3. The device as recited in claim 1, wherein the absorber layer includes a Cu—Zn—Sn containing chalcogenide material with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$.

4. The device as recited in claim 1, wherein the buffer layer includes one of CdS, CdTe, ZnS, Zn(O,S), $In_2S_3$ and/or ZnO.

5. The device as recited in claim 1, wherein the protection layer includes $Al_2O_3$ with a thickness of less than about 25 Angstroms.

6. The device as recited in claim 1, wherein the conductive layer includes molybdenum on a glass substrate.

7. The device as recited in claim 1, wherein the absorber layer includes a thickness of between about 0.2 to 4.0 microns.

8. The device as recited in claim 1, wherein the absorber layer includes at least one of $Cu(In,Ga)(S,Se)_2$ (CIGS), $Cu_2S$, or CdTe.

9. The device as recited in claim 1, wherein the absorber layer includes a band gap between approximately 1 to 1.5 electron volts (eV).

10. The device as recited in claim 1, further comprising a substrate, wherein the conductive layer is disposed on the substrate.

11. The device as recited in claim 1, wherein the protection layer includes a metal oxide.

* * * * *